(12) United States Patent
Moakes et al.

(10) Patent No.: US 7,388,757 B2
(45) Date of Patent: Jun. 17, 2008

(54) MONOLITHIC BACKPLANE HAVING A FIRST AND SECOND PORTION

(75) Inventors: Paul A. Moakes, Derby (GB); Brian A. Carr, Loughborough (GB)

(73) Assignee: Emerson Network Power - Embedded Computing, Inc., Madison, WI (US)

( * ) Notice: Subject to any disclaimer, the term of this patent is extended or adjusted under 35 U.S.C. 154(b) by 25 days.

(21) Appl. No.: 11/287,765

(22) Filed: Nov. 28, 2005

(65) Prior Publication Data

US 2007/0121306 A1    May 31, 2007

(51) Int. Cl.
*H01R 12/16* (2006.01)
(52) U.S. Cl. .................... 361/788; 361/796; 361/756
(58) Field of Classification Search .......... 361/788, 361/796, 756; 710/301, 300
See application file for complete search history.

(56) References Cited

U.S. PATENT DOCUMENTS

| | | | | |
|---|---|---|---|---|
| 6,392,142 | B1 * | 5/2002 | Uzuka et al. ............. | 174/541 |
| 2006/0023384 | A1 * | 2/2006 | Mukherjee et al. ......... | 361/103 |
| 2006/0221581 | A1 * | 10/2006 | DeNies et al. ............ | 361/740 |
| 2006/0221588 | A1 * | 10/2006 | Summers et al. .......... | 361/796 |

OTHER PUBLICATIONS

"Advanced MC™ Advanced Mezzanine Card Base Specification", PICMG® AMC.0 RC1.1, PCI Industrial Computers PICMG®, Dec. 3, 2004, pp. iii thru C6.

"Micro TCA™ Micro Telecom Compute Architecture Base Specification", PICMG® MicroTCA.0 Draft 0.6, PCI Industrial Computers PICMA®, Jul. 11, 2005, pp. ii thru 8-6.

* cited by examiner

*Primary Examiner*—Diego Gutierrez
*Assistant Examiner*—Yuriy Semenenko
(74) *Attorney, Agent, or Firm*—Harness Dickey & Pierce P.L.C.

(57) ABSTRACT

A subrack having a front side and a rear side, wherein the subrack is coupled to receive an Advanced Mezzanine Card module, the subrack includes a monolithic backplane having a first portion and second portion, where the first portion runs substantially along the front side and the second portion runs substantially along the rear side. A first slot is to receive the Advanced Mezzanine Card module inserted via the front side and connect the Advanced Mezzanine Card module directly to the second portion of the monolithic backplane. A second slot is to receive the Advanced Mezzanine Card module inserted via the rear side and connect the Advanced Mezzanine Card module directly to the first portion of the monolithic backplane. A virtual carrier manager, where the virtual carrier manager provides a control management function for the Advanced Mezzanine Card module, where the virtual carrier manager provides a central switching function for the Advanced Mezzanine Card module, and where the virtual carrier manager provides a power control function for the Advanced Mezzanine Card module.

8 Claims, 3 Drawing Sheets

-PRIOR ART-

MONOLITHIC BACKPLANE HAVING A FIRST AND SECOND PORTION

RELATED APPLICATION

Related subject matter is disclosed in U.S. patent application entitled "SUBRACK WITH FRONT AND REAR INSERTION OF AMC MODULES" having application Ser. No. 11/287,994 filed Nov. 28, 2005.

BACKGROUND OF INVENTION

The PCI Industrial Computer Manufacturers Group (PICMG®) Micro Telecommunications Architecture (MicroTCA™) defines the requirements for a system that uses PICMG Advanced Mezzanine Card (AMC) modules directly on a backplane (PICMG® MicroTCA.0 Draft 0.6—Micro Telecom Compute Architecture Base Specification). MicroTCA may serve as a platform for telecommunications and enterprise computer network equipment as well as consumer premises equipment. MicroTCA is complimentary to PICMG3 Advanced Telecommunications Computing Architecture (AdvancedTCA®, or PICMG3). While ATCA is optimized for high capacity, high performance applications, MicroTCA addresses cost-sensitive and physically smaller applications with lower capacity, performance and less-stringent availability requirements.

In the prior art MicroTCA systems, all modules are inserted from one side of the subrack or chassis (i.e. the front of the subrack), resulting in all input/output (I/O) forced to be from the front of the subrack. This has the disadvantage in that all I/O cabling is in the front of the subrack, which blocks maintenance personnel from easily accessing the subrack and creates a hazardous and cluttered area where many subracks are present.

There is a need, not met in the prior art, to have a MicroTCA subrack where modules may be inserted from the front and the rear and where rear I/O is available to allow better access and more efficient routing of external cables. Accordingly, there is a significant need for an apparatus that overcomes the deficiencies of the prior art outlined above.

BRIEF DESCRIPTION OF THE DRAWINGS

Representative elements, operational features, applications and/or advantages of the present invention reside inter alia in the details of construction and operation as more fully hereafter depicted, described and claimed—reference being made to the accompanying drawings forming a part hereof, wherein like numerals refer to like parts throughout. Other elements, operational features, applications and/or advantages will become apparent in light of certain exemplary embodiments recited in the Detailed Description, wherein:

Elements in the Figures are illustrated for simplicity and clarity and have not necessarily been drawn to scale. For example, the dimensions of some of the elements in the Figures may be exaggerated relative to other elements to help improve understanding of various embodiments of the present invention. Furthermore, the terms "first", "second", and the like herein, if any, are used inter alia for distinguishing between similar elements and not necessarily for describing a sequential or chronological order. Moreover, the terms "front", "back", "top", "bottom", "over", "under", and the like in the Description and/or in the Claims, if any, are generally employed for descriptive purposes and not necessarily for comprehensively describing exclusive relative position. Any of the preceding terms so used may be interchanged under appropriate circumstances such that various embodiments of the invention described herein may be capable of operation in other configurations and/or orientations than those explicitly illustrated or otherwise described.

DETAILED DESCRIPTION OF EXEMPLARY EMBODIMENTS

The following representative descriptions of the present invention generally relate to exemplary embodiments and the inventor's conception of the best mode, and are not intended to limit the applicability or configuration of the invention in any way. Rather, the following description is intended to provide convenient illustrations for implementing various embodiments of the invention. As will become apparent, changes may be made in the function and/or arrangement of any of the elements described in the disclosed exemplary embodiments without departing from the spirit and scope of the invention.

For clarity of explanation, the embodiments of the present invention are presented, in part, as comprising individual functional blocks. The functions represented by these blocks may be provided through the use of either shared or dedicated hardware, including, but not limited to, hardware capable of executing software. The present invention is not limited to implementation by any particular set of elements, and the description herein is merely representational of one embodiment.

Software blocks that perform embodiments of the present invention can be part of computer program modules comprising computer instructions, such control algorithms that are stored in a computer-readable medium such as memory. Computer instructions can instruct processors to perform any methods described below. In other embodiments, additional modules could be provided as needed.

A detailed description of an exemplary application is provided as a specific enabling disclosure that may be generalized to any application of the disclosed system, device and method for a MicroTCA subrack in accordance with various embodiments of the present invention.

Figure 1:
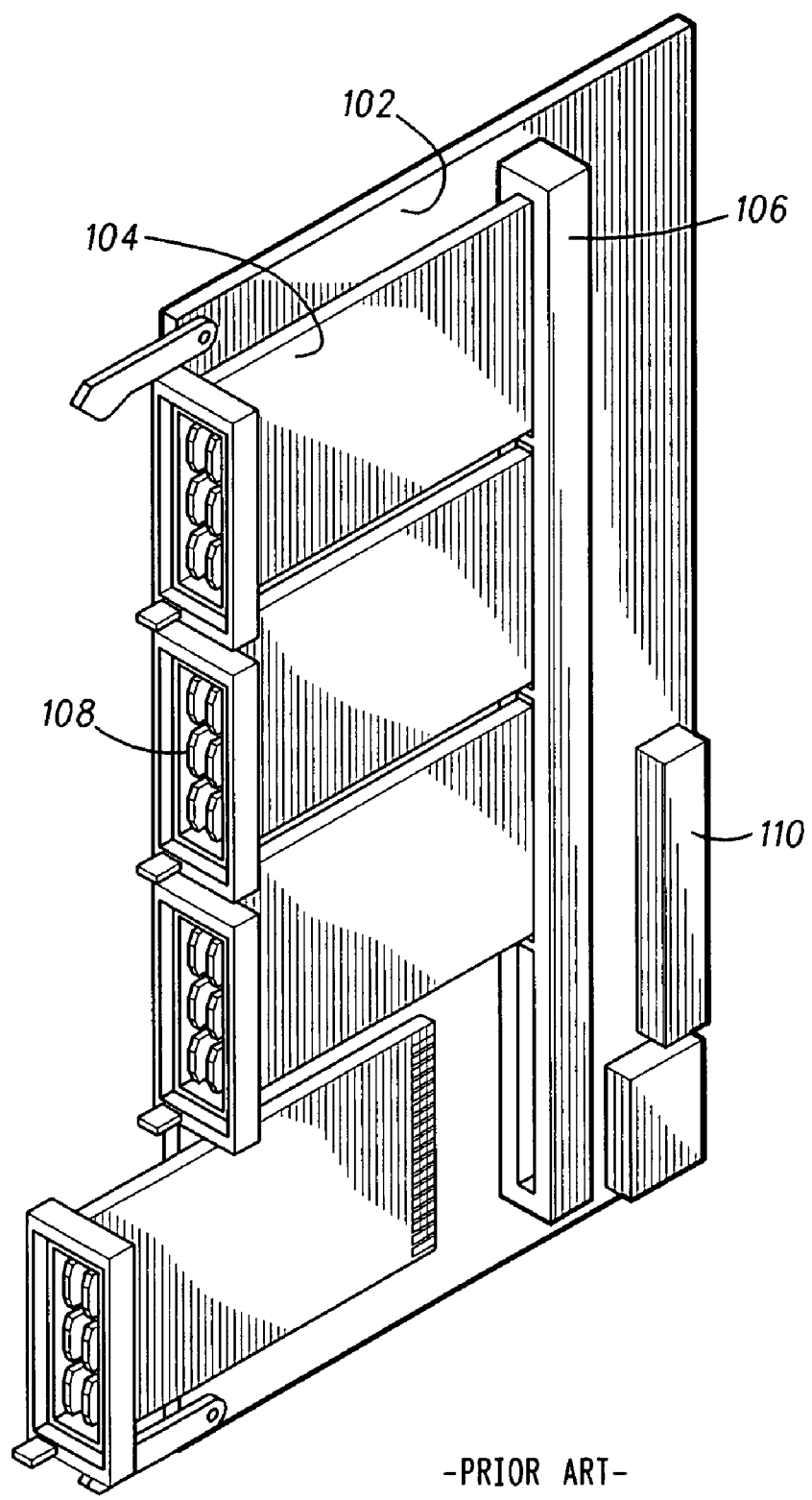
FIG. 1 representatively illustrates a prior art carrier card.

FIG. 1 representatively illustrates a prior art carrier card 102. Conventional subrack-based, modular computer systems have slots for the insertion of payload cards that add functionality to the computer system. Payload cards are designed to plug direction into the backplane of a chassis. These payload cards may include processors, memory, storage devices, wireless communication modules, I/O ports, and the like. Carrier cards are payload cards that are designed to have one or more mezzanine cards plugged into them to add even more modular functionality to the computer system. Mezzanine cards are different from payload cards in that mezzanine cards are not coupled to physically connect directly with the backplane, whereas payload cards function to physically directly connect with the backplane.

For example, carrier card 102 may include a backplane connector 110 to interface with the backplane in a conventional subrack, modular computer system for instance an AdvancedTCA subrack as defined in the PICMG 3.0

AdvancedTCA specification. Carrier card 102 further includes connectors for coupling mezzanine cards to the carrier card 102. Mezzanine cards can also add functionality to a computer system and may include central switching devices, processors, memory, storage devices, wireless communication modules, I/O ports, and the like. In the particular prior art example illustrated in FIG. 1, carrier card 102 includes Advanced Mezzanine Card (AMC) connector 106 for coupling an AMC module 104 to carrier card 102. AMC module 104 may include one or more I/O ports 108 for providing an external link to carrier card 102 and the computer system to which carrier card 102 is coupled. The Advanced Mezzanine Card Base Specification (PICMG® AMC.0 RC1.1) defines the AMC module 104 that is coupled to the carrier card 102. AMC modules 104 may lie parallel to and are integrated into carrier card 102 via AMC connector 106.

AMC modules 104 can be single-width, double-width, full-height, half-height modules or any combination thereof as defined by the AMC specification. Carrier card 102 may be conventional, cutaway or hybrid carrier cards as defined in the AMC specification. AMC connector 106 may be a B connector, AB connector, basic connector, extended connector or any combination thereof. B connectors may be used with conventional carrier cards and support single layer and full-height AMC modules. AB connectors may be used on cutaway carrier cards and support a stacked configuration of two half-height AMC modules. All AMC connectors 106 use a card edge connection style, where conductive traces at the edge of the AMC module 104 printed circuit board (PCB) act as male pins, which mate to a female portion in the AMC connector 106. A basic connector style is equipped to interface with an AMC module 104 having traces on one side of the PCB. An extended connector is equipped to interface with an AMC module 104 having traces on both sides of the PCB.

Figure 2:
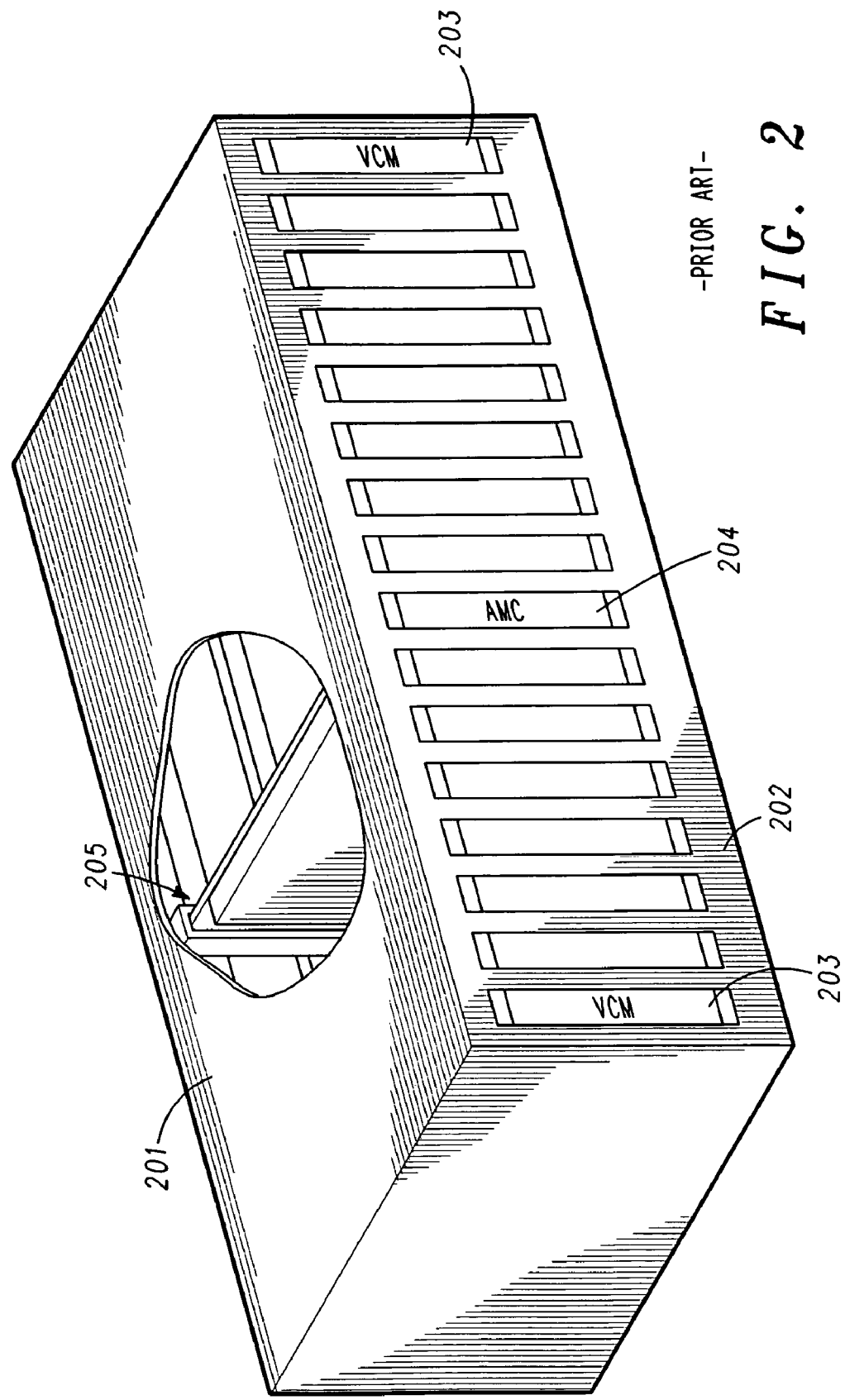
FIG. 2 representatively illustrates a prior art MicroTCA subrack.

FIG. 2 representatively illustrates a prior art MicroTCA subrack 201. Details on MicroTCA subrack design and configurations can be found in PICMG® MicroTCA.0 Draft 0.6—Micro Telecom Compute Architecture Base Specification. The prior art MicroTCA system is a collection of interconnected elements including at least one AMC module 204, at least one virtual carrier manager (VCM) 203 and the interconnect, power, cooling and mechanical resources need to support them. A typical prior art MicroTCA system may consist of twelve AMC modules 204, one (and optionally two for redundancy) virtual carrier managers 203 coupled to a backplane 205, and a subrack 201.

A VCM 203 acts as a virtual carrier card which emulates the requirements of the carrier card defined in the Advanced Mezzanine Card Base Specification (PICMG® AMC.0 RC1.1) to properly host AMC modules. Carrier card functional requirements include power delivery, interconnects, Intelligent Platform Management Interface (IPMI) management, and the like. VCM 203 combines the control and management infrastructure, interconnect fabric resources and the power control infrastructure for the AMC module(s) 204 into a single unit. VCM 203 comprises these common elements that are shared by all AMC modules 204 and is located on the backplane 205, on one or more AMC modules, or a combination thereof.

In the prior art, all AMC modules 204 and the VCM 203 are inserted in the subrack 201 from the front face 202 to interface with only one side of the backplane as shown. No AMC modules 204 are inserted from the rear of the chassis or interface with the other side of the backplane 205. Consequently, any I/O ports on the AMC modules 204 require external connections to be routed from the front face 202 of the subrack 201. Although FIG. 2 depicts a shelf implementation of a MicroTCA subrack, other prior art MicroTCA subracks (a cube implementation, and the like) are also limited to insertion of AMC modules though a single side (front) of the subrack and connection to a single side of the backplane.

Figure 3:
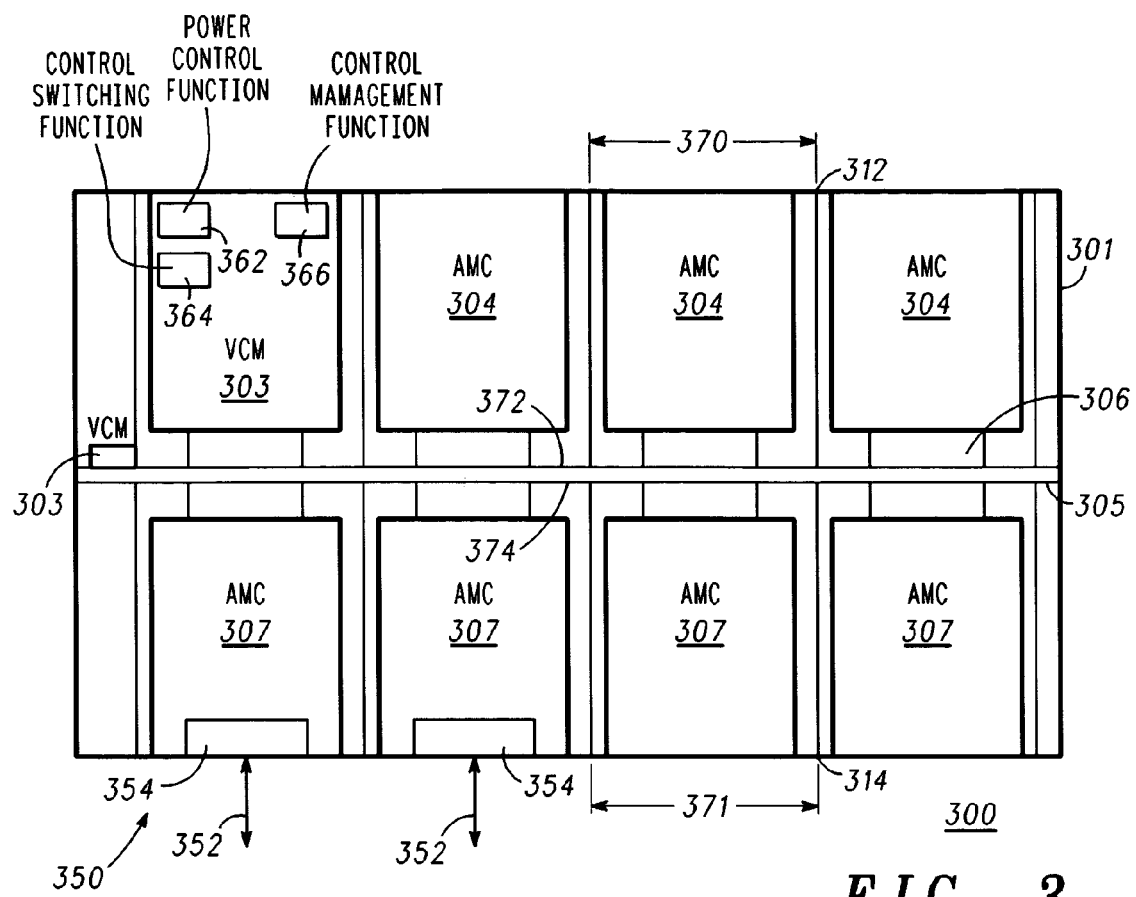
FIG. 3 representatively illustrates a computer system in accordance with an exemplary embodiment of the present invention.

FIG. 3 representatively illustrates a computer system 300 in accordance with an exemplary embodiment of the present invention. In the embodiment shown, subrack 301 includes a backplane 305 of a midplane type design having a first side 372 and a second side 374 opposite to each other, where AMC modules 304, 307 may be connected to both the first side 372 and the second side 374.

For example, subrack 301 may have a front side 312 with one or more first slots 370 coupled to receive a first AMC module 304 inserted via the front side 312, where the first AMC module 304 connects directly to the first side 372 of the backplane 305. Subrack 301 may also have a rear side 314 with one or more second slots 371 coupled to receive a second AMC module 307 inserted via the rear side 314, where second AMC module 307 connects directly to the second side 374 of the backplane 305.

Subrack 301 is illustrated in plan view with first AMC module 304 and second AMC module 307 mounted horizontally. In an embodiment, the form factor of subrack 301 is 1 U, where as known in the art, "U" and multiples of "U" can refer to the depth of a subrack or chassis. In an embodiment, "U" can measure approximately 1.75 inches. This is not limiting of the invention as subrack 301 may be orientated such that first AMC module 304 and second AMC module 307 may be mounted vertically or any combination of horizontally and vertically. Further, subrack 301 may have a form factor other than 1 U and be within the scope of the invention, for example and without limitation, 3 U, 6 U and 9U.

The Advanced Mezzanine Card Base Specification (PICMG® AMC.0 RC1.1) defines AMC modules 304, 307, which may add functionality to a computer system 300 and may include central switching devices, processors, memory, storage devices, wireless communication modules, I/O ports, and the like. First AMC module 304 and second AMC module 307 can be single-width, double-width, full-height, half-height modules or any combination thereof as defined by the AMC specification. AMC modules 304, 307 are not payload modules, but instead are mezzanine modules, particularly AMC modules, that connect directly to the backplane 305. This differentiates computer system 300 and subrack 301 from other conventional midplane designs where typical payload cards connect to a backplane.

In an embodiment, an AMC connector 306 at each of first slot 370 and second slot 371 is coupled to directly connect the first AMC module 304 and the second AMC module 307 to the first side 372 and the second side 374 of the backplane 305 respectively. AMC connector 306 may be a B connector, AB connector, basic connector, extended connector or any combination thereof, where the types of AMC connectors 306 are defined in the AMC specification and the MicroTCA specification. AMC connectors 306 may use a card edge connection style, where conductive traces at the edge of the AMC module 304, 307 printed circuit board (PCB) act as male pins, which mate to a female portion in the AMC connector 306. A basic AMC connector style is equipped to interface with an AMC module 304, 307 having traces on one side of the PCB. An extended AMC connector style is equipped to interface with an AMC module 304, 307 having traces on both sides of the PCB. AMC connector 306 may include both the basic AMC connector style and the extended AMC connector style.

In an embodiment, computer system 300 includes virtual carrier manager (VCM) 303. In subrack 301, a VCM 303 acts as a virtual carrier card which emulates the requirements of the carrier card defined in the Advanced Mezzanine Card Base Specification (PICMG® AMC.0 RC1.1) to properly host AMC modules 304, 307. Carrier card functional requirements include power delivery, interconnects, Intelligent Platform Management Interface (IPMI) management, and the like. VCM 303 may combine the control and management infrastructure, interconnect fabric resources and the power control infrastructure for the AMC module(s) 304, 307 into a single unit. VCM 303 comprises these common elements that are shared by all AMC modules 304, 307 and may be on the backplane 305, on one or more AMC modules 304, 307, or a combination thereof. Although VCM 303 is depicted on both an AMC module and on the backplane, this is not limiting of the invention. VCM 303 may be situated on the backplane 305, on one or more AMC modules 304, 307, or a combination thereof.

In an embodiment, VCM 303 includes control management function 366, which acts as a central authority in a computer system 300 by monitoring and controlling AMC modules 304, 307. In an embodiment, computer system 300 with VCM 303 is a MicroTCA computer system and subrack 301 is a MicroTCA subrack. The control management function 366 may make use of Intelligent Platform Management Interface (IPMI) links to each AMC module 304, 307, as well as presence detect, enable and geographic address signals. The control and management function 366 may also include the common overhead functions of clock distribution and test support. In an embodiment, three clock signals may be distributed to each AMC module 304, 307 from each VCM 303 in order to provide network grade synchronization to computer system 300. A set of JTAG test pins permit advanced testing of complete computer system 300, as well as individual elements.

In an embodiment, VCM 303 includes central switching function 364, such that a switched fabric 350 provides the main connectivity among the AMC modules 304, 307 in a computer system. This switched fabric 350 includes a central switch and a number of high speed serial lanes radiating to each slot and hence to each AMC module 304, 307. Lanes may be half duplex, differential high speed serial interconnects, with bandwidth capacities of at least 3.125 Gb/s. In another embodiment, these bit rates may be up to and beyond 10 Gb/s per lane. The central switching function 364 of VCM 303 is the hub of a star or a dual star network. In another embodiment, there may be supplementary paths directly from each AMC module 304, 307 to other AMC modules 304, 307 permitting the construction of supplemental mesh interconnects in addition to the star or dual star configurations. Clocking may be provided for the entire computer system 300 by a synchronization subcircuit on the VCM 303. It has the ability to receive a reference clock from one of the AMC modules 304, 307 it manages, use it to create a set of master synchronization clocks, and distribute these clocks across the backplane 305 to the AMC modules 304, 307.

In an embodiment, switched fabric 350 may be implemented by using one or more of a plurality of switched fabric network standards, for example and without limitation, InfiniBand™, Advanced Switching, Serial RapidIO™, FibreChannel™, Ethernet™, Gigabit Ethernet, PCI Express™, Hypertransport™, and the like. Switched fabric 350 is not limited to the use of these switched fabric network standards and the use of any switched fabric network standard is within the scope of the invention.

In an embodiment, VCM 303 includes power control function 362, which may function to supply and control the power to the AMC modules 304, 307. In an embodiment, a single 12V main power feed is routed to each AMC module 304, 307. The power infrastructure may take its supply bus (either 48V nominal, or AC mains) and convert it to one 12V distribution conductor to provide a radial payload power port to each AMC module 304, 307. Management power for all AMC modules 304, 307 may also be supplied by the power control function 362, which may also perform sequencing, protection and isolation functions.

In an embodiment, second AMC module 307 inserted via the rear side 314 of subrack 301 and connected to the second side 374 of backplane 305 may comprise an I/O port 354 to provide an external link 352 from subrack 301 and computer system 300. I/O port 354 and external link 352 may be coupled to extend switched fabric 350 outside of subrack 301, to facilitate transfer of data to/from computer system 300, and the like. In an embodiment, AMC modules 304 inserted via the front side 312 and connected to the first side 372 of backplane 305 may omit an I/O port and external link. In these embodiments, cabling associated with external link 352 may be run from the rear side 314 of subrack 301, thereby freeing up valuable space on the front side 312 and facilitating safer and more efficient routing of cables to/from subrack 301.

Figure 4:
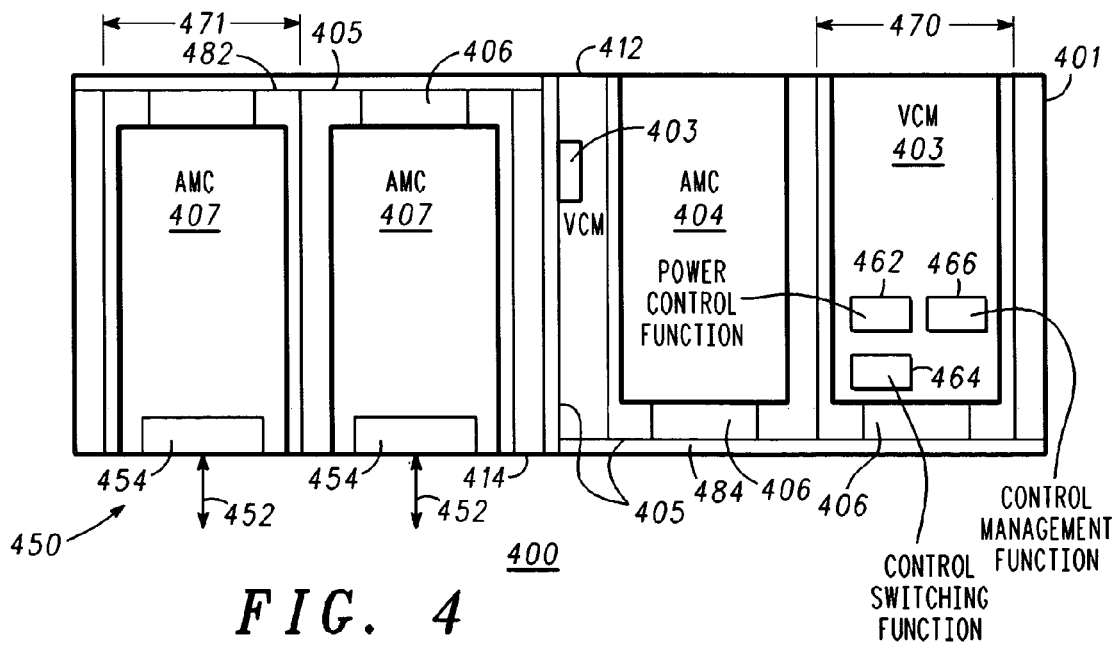
FIG. 4 representatively illustrates another computer system in accordance with an exemplary embodiment of the present invention.

FIG. 4 representatively illustrates another computer system 400 in accordance with an exemplary embodiment of the present invention. In the embodiment shown, subrack 401 includes a monolithic backplane 405 having a first portion 482 and a second portion 484, where the first portion 482 runs substantially along a front side 412 of the subrack 401 and the second portion 484 runs substantially along the rear side 414 of the subrack 401. The first portion 482 and the second portion 484 of monolithic backplane 405 are monolithic, meaning they form one unitary and functional backplane, but are not linearly aligned or linearly continuous as shown in FIG. 4. The first portion 482 and the second portion 484 are linearly discontinuous over the length of the subrack 401. In another embodiment, first portion 482 and second portion 484 may be linearly discontinuous over the height of subrack 401, or linearly discontinuous over both the length and height of subrack 401. AMC modules 404, 407 may be connected to both the first portion 482 and the second portion 484.

In an embodiment, subrack 401 may have a front side 412 with one or more first slots 470 coupled to receive a first AMC module 404 inserted via the front side 412, where the first AMC module 404 connects directly to the second portion 484 of monolithic backplane 405. Subrack 401 may also have a rear side 414 with one or more second slots 471 coupled to receive a second AMC module 407 inserted via the rear side 414, where second AMC module 407 connects directly to the first portion 482 of monolithic backplane 405.

Subrack 401 is illustrated in plan view with first AMC module 404 and second AMC module 407 mounted horizontally. In an embodiment, the form factor of subrack 401 is 1 U, where as known in the art, "U" and multiples of "U" can refer to the depth of a subrack or chassis. In an embodiment, "U" can measure approximately 1.75 inches. This is not limiting of the invention as subrack 401 may be orientated such that first AMC module 404 and second AMC module 407 may be mounted vertically or any combination of horizontally and vertically. Further, subrack 401 may have a form factor other than 1 U and be within the scope of the invention, for example and without limitation, 3 U, 6 U and 9 U.

The Advanced Mezzanine Card Base Specification (PICMG® AMC.0 RC1.1) defines AMC modules 404, 407, which may add functionality to a computer system 400 and may include central switching devices, processors, memory, storage devices, wireless communication modules, I/O ports, and the like. First AMC module 404 and second AMC module 407 can be single-width, double-width, full-height, half-height modules or any combination thereof as defined by the AMC specification. AMC modules 404, 407 are not payload modules, but instead are mezzanine modules, particularly AMC modules, that connect directly to the monolithic backplane 405. This differentiates computer system 400 and subrack 401 from other conventional midplane designs where typical payload cards connect to a backplane.

In an embodiment, an AMC connector 406 at each of first slot 470 and second slot 471 is coupled to directly connect the first AMC module 404 and the second AMC module 407 to the first portion 482 and the second portion 484 of the monolithic backplane 405 respectively. AMC connector 406 may be a B connector, AB connector, basic connector, extended connector or any combination thereof, where the types of AMC connectors 406 are defined in the AMC specification and the MicroTCA specification. AMC connectors 406 may use a card edge connection style, where conductive traces at the edge of the AMC module 404, 407 printed circuit board (PCB) act as male pins, which mate to a female portion in the AMC connector 406. A basic AMC connector style is equipped to interface with an AMC module 404, 407 having traces on one side of the PCB. An extended AMC connector style is equipped to interface with an AMC module 404, 407 having traces on both sides of the PCB. AMC connector 406 may include both the basic AMC connector style and the extended AMC connector style.

In an embodiment, computer system 400 includes virtual carrier manager (VCM) 403. In subrack 401, a VCM 403 acts as a virtual carrier card which emulates the requirements of the carrier card defined in the Advanced Mezzanine Card Base Specification (PICMG® AMC.0 RC1.1) to properly host AMC modules 404, 407. Carrier card functional requirements include power delivery, interconnects, Intelligent Platform Management Interface (IPMI) management, and the like. VCM 403 may combine the control and management infrastructure, interconnect fabric resources and the power control infrastructure for the AMC module(s) 404, 407 into a single unit. VCM 403 comprises these common elements that are shared by all AMC modules 404, 407 and may be on the monolithic backplane 405, on one or more AMC modules 404, 407, or a combination thereof. Although VCM 403 is depicted on both an AMC module and on the backplane, this is not limiting of the invention. VCM 403 may be situated on the backplane 405, on one or more AMC modules 404, 407, or a combination thereof.

In an embodiment, VCM 403 includes control management function 466, which acts as a central authority in a computer system 400 by monitoring and controlling AMC modules 404, 407. In an embodiment, computer system 400 with VCM 403 is a MicroTCA computer system and subrack 401 is a MicroTCA subrack. The control management function 466 may make use of Intelligent Platform Management Interface (IPMI) links to each AMC module 404, 407, as well as presence detect, enable and geographic address signals. The control and management function 466 may also include the common overhead functions of clock distribution and test support. In an embodiment, three clock signals may be distributed to each AMC module 404, 407 from each VCM 403 in order to provide network grade synchronization to computer system 400. A set of JTAG test pins permit advanced testing of complete computer system 400, as well as individual elements.

In an embodiment, VCM 403 includes central switching function 464, such that a switched fabric 450 provides the main connectivity among the AMC modules 404, 407 in a computer system. This switched fabric 450 includes a central switch and a number of high speed serial lanes radiating to each slot and hence to each AMC module 404, 407. Lanes may be half duplex, differential high speed serial interconnects, with bandwidth capacities of at least 3.125 Gb/s. In another embodiment, these bit rates may be up to and beyond 10 Gb/s per lane. The central switching function 464 of VCM 403 is the hub of a star or a dual star network. In another embodiment, there may be supplementary paths directly from each AMC module 404, 407 to other AMC modules 404, 407 permitting the construction of supplemental mesh interconnects in addition to the star or dual star configurations. Clocking may be provided for the entire computer system 400 by a synchronization subcircuit on the VCM 403. It has the ability to receive a reference clock from one of the AMC modules 404, 407 it manages, use it to create a set of master synchronization clocks, and distribute these clocks across the monolithic backplane 405 to the AMC modules 404, 407.

In an embodiment, switched fabric 450 may be implemented by using one or more of a plurality of switched fabric network standards, for example and without limitation, InfiniBand™, Advanced Switching, Serial RapidIO™, FibreChannel™, Ethernet™, Gigabit Ethernet, PCI Express™, Hypertransport™, and the like. Switched fabric 450 is not limited to the use of these switched fabric network standards and the use of any switched fabric network standard is within the scope of the invention.

In an embodiment, VCM 403 includes power control function 462, which may function to supply and control the power to the AMC modules 404, 407. In an embodiment, a single 12V main power feed is routed to each AMC module 404, 407. The power infrastructure may take its supply bus (either 48V nominal, or AC mains) and convert it to one 12V distribution conductor to provide a radial payload power port to each AMC module 404, 407. Management power for all AMC modules 404, 407 may also be supplied by the power control function 462, which may also perform sequencing, protection and isolation functions.

In an embodiment, second AMC modules 407 inserted via the rear side 414 of subrack 401 and connected to the first portion 482 of monolithic backplane 405 may comprise an I/O port 454 to provide an external link 452 from subrack 401 and computer system 400. I/O port 454 and external link 452 may be coupled to extend switched fabric 450 outside of subrack 401, to facilitate transfer of data to/from computer system 400, and the like. In an embodiment, AMC modules 404 inserted via the front side 412 and connected to the second side 484 of monolithic backplane 405 may omit an I/O port and external link. In these embodiments, cabling associated with external link 452 may be run from the rear side 414 of subrack 401, thereby freeing up valuable space on the front side 412 and facilitating safer and more efficient routing of cables to/from subrack 401.

In the foregoing specification, the invention has been described with reference to specific exemplary embodiments; however, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above.

For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

As used herein, the terms "comprise", "comprises", "comprising", "having", "including", "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

We claim:

1. A subrack having a front side and a rear side, wherein the subrack is coupled to receive an Advanced Mezzanine Card module, the subrack comprising:
   a monolithic backplane having a first portion and a second portion, wherein the first portion runs substantially along the front side of the subrack and the second portion runs substantially along the rear side of the subrack;
   a first slot, wherein the first slot is coupled to receive a first Advanced Mezzanine Card module inserted via the front side and connect the first Advanced Mezzanine Card module directly to the second portion of the monolithic backplane;
   a second slot, wherein the second slot is coupled to receive a second Advanced Mezzanine Card module inserted via the rear side and connect the second Advanced Mezzanine Card module directly to the first portion of the monolithic backplane;
   an Advanced Mezzanine Card (AMC) connector at each of the first slot and the second slot, wherein the AMC connector is coupled to directly connect the first and second Advanced Mezzanine Card modules to the monolithic backplane; and
   a virtual carrier manager, wherein the virtual carrier manager provides a control management function for the first and second Advanced Mezzanine Card modules, wherein the virtual carrier manager provides a central switching function for the first and second Advanced Mezzanine Card modules, and wherein the virtual carrier manager provides a power control function for the first and second Advanced Mezzanine Card modules.

2. The subrack of claim 1, wherein the second Advanced Mezzanine Card module inserted via the rear side and connected to the first portion of the monolithic backplane comprises an I/O port.

3. The subrack of claim 1, where the second Advanced Mezzanine Card module inserted via the rear side and connected to the first portion of the monolithic backplane provides an external link from the rear side of the subrack.

4. The subrack of claim 1, wherein the subrack operates a switched fabric.

5. The subrack of claim 1, wherein the virtual carrier manager is distributing among at least one of the monolithic backplane and the first and second Advanced Mezzanine Card modules.

6. The subrack of claim 1, wherein the virtual carrier manager emulates a carrier card.

7. The subrack of claim 1, wherein the virtual carrier manager and the first and second Advanced Mezzanine Card modules form a switched fabric.

8. The subrack of claim 1, wherein the subrack is a MicroTCA subrack.

\* \* \* \* \*